(12) United States Patent
Okawa et al.

(10) Patent No.: US 9,296,649 B2
(45) Date of Patent: Mar. 29, 2016

(54) PROCESS FOR PRODUCING LAMINATE, AND LAMINATE

(71) Applicant: ASAHI GLASS COMPANY, LIMITED, Chiyoda-ku (JP)

(72) Inventors: Jun Okawa, Tokyo (JP); Kazuya Yaoita, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/471,309

(22) Filed: Aug. 28, 2014

(65) Prior Publication Data

US 2014/0363685 A1 Dec. 11, 2014

Related U.S. Application Data

(63) Continuation of application No. PCT/JP2013/055573, filed on Feb. 28, 2013.

(30) Foreign Application Priority Data

Feb. 28, 2012 (JP) ................... 2012-041393

(51) Int. Cl.
*B32B 15/04* (2006.01)
*B32B 17/06* (2006.01)
(Continued)

(52) U.S. Cl.
CPC ........ *C03C 17/3602* (2013.01); *B32B 17/10229* (2013.01); *C03C 17/36* (2013.01); *C03C 17/366* (2013.01); *C03C 17/3681* (2013.01); *C23C 14/0057* (2013.01); *C23C 14/086* (2013.01); *C23C 28/32* (2013.01); *C23C 28/321* (2013.01); *C23C 28/345* (2013.01); *C03C 2217/211* (2013.01); *C03C 2217/216* (2013.01); *C03C 2217/228* (2013.01); *C03C 2218/154* (2013.01); *Y10T 428/31678* (2015.04)

(58) Field of Classification Search
USPC ......... 428/428, 432, 433, 434, 688, 689, 697, 428/698, 699, 701, 702
See application file for complete search history.

(56) References Cited

U.S. PATENT DOCUMENTS 5,413,864 A * 5/1995 Miyazaki et al. ............. 428/432
5,532,062 A * 7/1996 Miyazaki et al. ............. 428/432
(Continued)

FOREIGN PATENT DOCUMENTS

JP 62-41740 2/1987
JP 4-357025 12/1992
(Continued)

OTHER PUBLICATIONS

International Search Report issued Jun. 4, 2013 in PCT/JP2013/055573 filed Feb. 27, 2013.

*Primary Examiner* — Lauren Robinson
*Assistant Examiner* — Lauren Colgan
(74) *Attorney, Agent, or Firm* — Oblon, McClelland, Maier & Neustadt, L.L.P.

(57) ABSTRACT

A laminate which contains a transparent substrate, a unit layer formed on the transparent substrate, and a tin zinc oxide layer formed on the unit layer. The unit layer contains a dielectric layer, a metal layer, a barrier layer, and a dielectric layer in this order starting from the transparent substrate side, and the dielectric layers contain substantially no carbon. The tin zinc oxide layer contains an oxide of tin and zinc as the main component and further contains carbon in an amount of at least 0.1 atomic % to the total amount of tin and zinc.

10 Claims, 1 Drawing Sheet

(51) Int. Cl.

| | |
|---|---|
| *C03C 17/36* | (2006.01) |
| *C23C 14/00* | (2006.01) |
| *C23C 14/08* | (2006.01) |
| *C23C 28/00* | (2006.01) |
| *B32B 17/10* | (2006.01) |

(56) References Cited

U.S. PATENT DOCUMENTS

| | | | |
|---|---|---|---|
| 5,942,090 A * | 8/1999 | Ebisawa et al. | 204/192.15 |
| 2001/0031365 A1 * | 10/2001 | Anderson et al. | 428/432 |
| 2006/0134436 A1 * | 6/2006 | Maschwitz | 428/426 |
| 2012/0087005 A1 * | 4/2012 | Reymond et al. | 359/360 |
| 2013/0025672 A1 * | 1/2013 | Auvray et al. | 136/256 |
| 2014/0120341 A1 * | 5/2014 | Kharchenko et al. | 428/312.6 |

FOREIGN PATENT DOCUMENTS

| | | |
|---|---|---|
| JP | 5-229052 | 9/1993 |
| JP | 10-237630 | 9/1998 |
| JP | 2010-31346 | 2/2010 |
| JP | 2010-236079 | 10/2010 |

* cited by examiner

PROCESS FOR PRODUCING LAMINATE, AND LAMINATE

TECHNICAL FIELD

The present invention relates to a process for producing a laminate, and a laminate. Particularly, it relates to a process for producing a laminate having a low emissivity, and a laminate.

BACKGROUND ART

Heretofore, in order to suppress radiation for heat rays thereby to reduce the burden of cooling and heating, a laminate having a low emissivity has been used for window glass of buildings, automobiles, etc. A laminate comprises, for example, a transparent substrate such as a glass substrate and a heat ray-shielding film formed on the substrate. Such a laminate is required to have a low heat emissivity so as to keep the heat in a room, a heat ray-shielding film is usually required to have a low emissive metal layer, and for example, one having a dielectric layer, a metal layer and a dielectric layer formed in this order, and one further having a metal layer and a dielectric layer repeatedly formed in addition, have been known. Such a heat ray-shielding film is also called a Low-E (low-emissivity) film, and glass having such a film formed thereon is called Low-E glass.

As a dielectric layer, one containing tin oxide, zinc oxide or antimony oxide as the main component has been known. Further, as the metal layer, one containing silver, gold, copper, palladium or rhodium as the main component has been known. As a representative laminate, for example, one which comprises a dielectric layer containing zinc oxide as the main component and a metal layer containing silver or a silver alloy as the main component has been known (for example, Patent Document 1 or 2).

A laminate is usually used as double glass or laminated glass, and during storage of a laminate after film formation until a step of assembling double glass or until a step for producing laminated glass, white spots will form by moisture in the environment, and the laminate is not necessarily excellent in storage property or handling efficiency. A reduction of the internal stress of the dielectric layer as the uppermost layer has been known to be effective for improvement of the moisture resistance, and as such a layer, a tin oxide film or a zinc oxide film which has another element having an ionic radius smaller than a bivalent zinc ion in an oxidized state added thereto has been known.

However, in a case where a laminate having the above tin oxide film, zinc oxide film or the like is produced by a large deposition apparatus to be used for production of glass for buildings or glass for automobiles, the internal stress may not sufficiently be lowered by moisture remaining in the sputtering apparatus, and the moisture resistance of the resulting laminate is insufficient in some cases. In order to further improve the moisture resistance, it has been known to form at least one dielectric layer, for example, by sputtering using a target containing zinc, tin or the like as the main component in an atmosphere containing a gas containing carbon atoms (for example, Patent Document 3).

PRIOR ART DOCUMENTS

Patent Documents

Patent Document 1: JP-A-62-41740
Patent Document 2: JP-A-5-229052
Patent Document 3: JP-A-10-237630

DISCLOSURE OF INVENTION

Technical Problem

On the other hand, with respect to the laminate, its surface is cleaned e.g. by a brush rotating at a high speed at the time of production, and streaky scratches may form by e.g. the brush rotating at a high speed, and the laminate is thereby required to be excellent in the abrasion resistance. Further, as mentioned above, it has been known to form a dielectric layer by sputtering using a target containing zinc, tin or the like as the main component in an atmosphere containing a gas containing carbon atoms, however, the abrasion resistance cannot necessarily be improved merely by replacing a conventional dielectric layer with such a dielectric layer. That is, it has been difficult to produce a laminate excellent in both the moisture resistance and the abrasion resistance by conventional technique.

The present invention has been made to solve the above problems and its object is to provide a production process to produce a laminate excellent in the moisture resistance and the abrasion resistance. Further, another object of the present invention is to provide a laminate excellent in the moisture resistance and the abrasion resistance.

Solution to Problem

The process for producing a laminate of the present invention comprises a first step of forming a dielectric layer, a metal layer and a dielectric layer in this order on a transparent substrate, and a second step of, after the first step, forming a tin zinc oxide layer containing an oxide of tin and zinc as the main component. Formation of the tin zinc oxide layer in the second step is carried out by sputtering using a metal target containing tin and zinc as the main component in a gas atmosphere in which a gas containing carbon atoms substantially functions as an oxidizing gas. Formation of the dielectric layer in the first step is carried out in a gas atmosphere in which a gas containing no carbon atom substantially functions as an oxidizing gas.

The laminate of the present invention comprises a transparent substrate, a unit layer formed on the transparent substrate, comprising a dielectric layer, a metal layer and a dielectric layer in this order from the transparent substrate side, and a tin zinc oxide layer formed on the unit layer, containing an oxide of tin and zinc as the main component and containing carbon in an amount of at least 0.1 atomic % to the total amount of tin and zinc.

Advantageous Effects of Invention

According to the process for producing a laminate of the present invention, particularly by carrying out sputtering using a metal target containing tin and zinc as the main component in an atmosphere containing a gas containing carbon atoms to form a tin zinc oxide layer containing an oxide of tin and zinc as the main component after the first step of forming a dielectric layer, a metal layer and a dielectric layer in this order on a transparent substrate, a laminate having improved moisture resistance and abrasion resistance can be produced.

According to the laminate of the present invention, which has a tin zinc oxide layer containing an oxide of tin and zinc as the main component and containing carbon in an amount of at least 0.1 atomic % to the total amount of tin and zinc, on the unit layer comprising a dielectric layer, a metal layer and a dielectric layer formed in this order, it is possible to improve the moisture resistance and the abrasion resistance.

DESCRIPTION OF EMBODIMENTS

Now, embodiments of the present invention will be described.

The process for producing a laminate of the present invention comprises a first step of forming a dielectric layer, a metal layer and a dielectric layer in this order on a transparent substrate, and a second step of, after the first step, forming a tin zinc oxide layer containing an oxide of tin and zinc as the main component. Formation of the tin zinc oxide layer in the second step is carried out by sputtering using a metal target containing tin and zinc as the main component in a gas atmosphere in which a gas containing carbon atoms substantially functions as an oxidizing gas. Formation of the dielectric layer in the first step is carried out in a gas atmosphere in which a gas containing no carbon atom substantially functions as an oxidizing gas.

According to the production process of the present invention, which comprises a first step of forming a dielectric layer, a metal layer and a dielectric layer in this order on a transparent substrate and then a second step of forming a tin zinc oxide layer containing an oxide of tin and zinc as the main component, wherein formation of the tin zinc oxide layer in the second step is carried out by sputtering using a metal target containing tin and zinc as the main component in the gas atmosphere in which a gas containing carbon atoms substantially functions as an oxidizing gas, it is possible to produce a laminate having improved moisture resistance and abrasion resistance.

That is, heretofore, it has been known to form a dielectric layer by sputtering using a metal target containing zinc, tin or the like as the main component in an atmosphere containing a gas containing carbon atoms. The moisture resistance can be improved by replacing a conventional dielectric layer with such a dielectric layer. However, the abrasion resistance cannot necessarily be improved merely by replacing a conventional dielectric layer.

According to the production process of the present invention, by forming dielectric layers sandwiching a metal layer in a gas atmosphere in which a gas containing no carbon atom substantially functions as an oxidizing gas in the first step, and then forming a tin zinc oxide layer by sputtering using a metal target containing tin and zinc as the main component in a gas atmosphere in which a gas containing carbon atoms substantially functions as an oxidizing gas, a laminate having not only moisture resistance but also abrasion resistance remarkably improved can be produced by synergistic effects of the dielectric layers formed in a gas atmosphere in which a gas containing no carbon atom substantially functions as an oxidizing gas and the tin zinc oxide layer formed in a gas atmosphere in which a gas containing carbon atoms substantially functions as an oxidizing gas.

Figure 1:
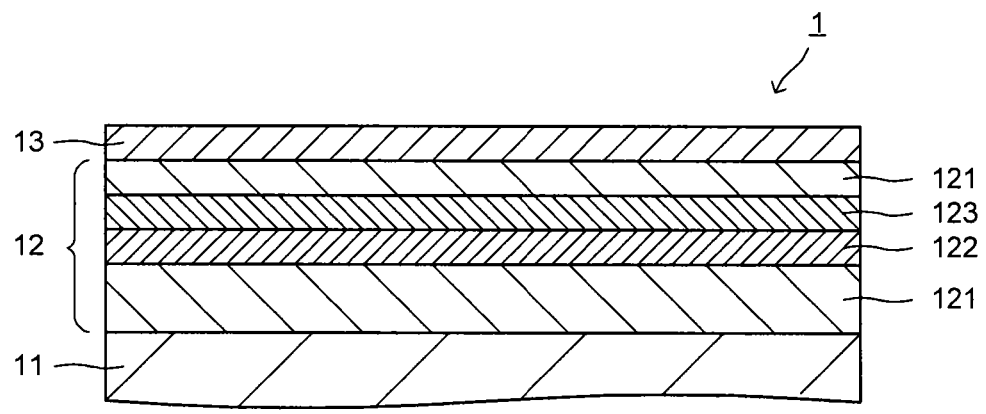
FIG. 1 is a cross-sectional view illustrating an example of a laminate of the present invention.

FIG. 1 is a cross-sectional view schematically illustrating an example of a laminate produced by the production process of the present invention. A laminate 1 comprises, for example, a transparent substrate 11, and a unit layer 12 is formed on the substrate by the first step. The unit layer 12 comprises, for example, a dielectric layer 121, a metal layer 122, a barrier layer 123 and a dielectric layer 121 formed in this order, and the two dielectric layers 121 are formed in a gas atmosphere in which a gas containing no carbon atom substantially functions as an oxidizing gas. Further, on the unit layer 12, a tin zinc oxide layer 13 containing an oxide of tin and zinc as the main component is formed by the second step. The tin zinc oxide layer 13 is formed by sputtering using a metal target containing tin and zinc as the main component in a gas atmosphere in which a gas containing carbon atoms substantially functions as an oxidizing gas.

Figure 2:
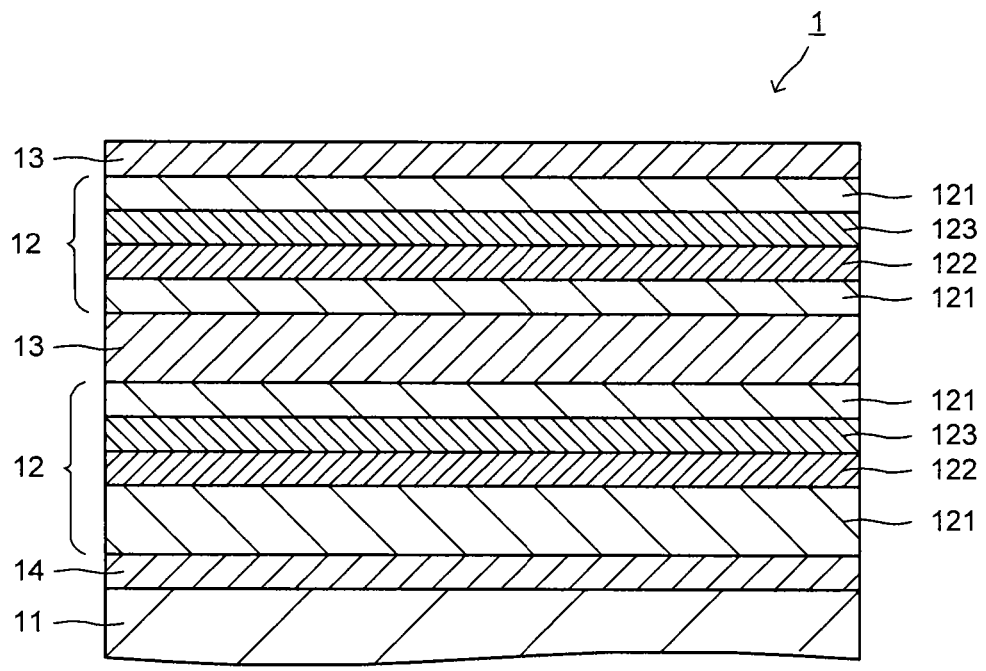
FIG. 2 is a cross-sectional view illustrating another example of a laminate of the present invention.

FIG. 2 is a cross-sectional view schematically illustrating another example of a laminate. According to the production process of the present invention, on a transparent substrate 11, a unit layer 12 is formed by the first step, a tin zinc oxide layer 13 is formed by the second step, and further a unit layer 12 may be formed by the first step and a tin zinc oxide layer 13 may be formed by the second step. The number of repetition of the combination comprising the first step and then the second step may be two as shown in FIG. 2, or may be three or more although not shown.

The number of repetition of the combination comprising the first step and then the second step is not particularly limited so long as it is at least one, however, if the number of repetition is large, only a low visible light transmittance insufficient for use as a window for buildings, automobiles or railway vehicles will be obtained. Accordingly, the number of repetition is preferably from 1 to 4, more preferably from 1 to 3.

Further, as shown in FIG. 2, the production process of the present invention may have, prior to the first step first carried out among the first steps, a preliminary step of forming a base layer 14 containing an oxide of tin and zinc as the main component by sputtering using a metal target containing tin and zinc as the main component in an atmosphere containing a gas containing carbon atoms.

The transparent substrate 11 is not particularly limited so long as it is transparent, and for example, inorganic and transparent plate glass such as window glass for buildings, commonly used float plate glass, or soda lime glass produced by a rollout method may be mentioned. As such plate glass, colorless glass such as clear glass or highly transmitting glass or green or other various color glass such as heat ray absorbing glass may be used, and the shape and the like of glass are not particularly limited. However, considering the visible light transmittance, etc., preferred is colorless transparent glass such as clear glass, highly transmitting glass or float plate glass.

Further, as the transparent substrate 11, not only flat plate glass or curved plate glass but also various tempered glass such as air cooled tempered glass or chemically tempered glass and in addition, wire-reinforced glass may be used. Further, various glass substrates made of borosilicate glass, low expansion glass, zero expansion glass, low expansion crystallized glass, zero expansion crystallized glass, etc. may be used. Further, as examples other than the glass substrate, amorphous resin substrates made of a polyethylene terephthalate resin, a polycarbonate resin, a polyvinyl chloride resin, a polyethylene resin, etc. may be mentioned. The thickness of the transparent substrate 11 is not necessarily limited, and is usually preferably from 1 to 10 mm.

The dielectric layer 121 is not particularly limited so long as it is made of a metal oxide, and is preferably one containing an oxide of zinc as the main component. By containing an oxide of zinc as the main component, for example, in a case where a metal layer 122 is formed thereon, crystallization of the metal layer 122 can be promoted to make it homogeneous and dense. The dielectric layer 121 may contain, for example, at least one additive element selected from tin, aluminum, chromium, titanium, silicon, boron, magnesium and gallium. By addition of the additive element, it is possible to improve the visible light transmittance and the near infrared light transmittance of the laminate 1. Here, "containing an oxide of zinc as the main component" specifically means that an oxide of zinc is contained in an amount of at least 90 mass % to the total amount of zinc and the additive element.

In the dielectric layer 121, zinc, tin, aluminum, chromium, titanium, silicon, boron, magnesium and gallium are contained, for example, as zinc oxide (ZnO), tin oxide ($SnO_2$), aluminum oxide ($Al_2O_3$), chromium oxide ($Cr_2O_3$), titanium oxide ($TiO_2$), silicon oxide ($SiO_2$), boron oxide ($B_2O_3$), magnesium oxide (MgO), gallium oxide ($Ga_2O_3$) or a composite oxide thereof. As the additive element, preferred is aluminum or tin, which is available at a low cost. Aluminum is preferred since it is an inexpensive material and can make the deposition rate high. Tin is also preferred since it is a relatively inexpensive material.

In a case where the additive element is contained, the amount of the additive element is preferably from 0.1 to 10 wt % to the total amount of zinc and the additive element. When the amount of the additive element is at least 0.1 wt %, the visible light transmittance and the near infrared light transmittance can efficiently be improved. Further, when the amount of the additive element is at most 10 mass %, the stability of the metal layer 122 formed on the dielectric layer 121 can be secured. For example, in a case where aluminum is contained as the additive element, the amount of aluminum is preferably from 0.1 to 10 mass %, more preferably from 0.1 to 5.0 mass % to the total amount of zinc and aluminum.

The thickness of the dielectric layer 121 slightly varies, for example, depending upon the position of the dielectric layer 121 in the unit layer 12, that is, whether the dielectric layer 121 is above or below the metal layer 122, the position of the unit layer 12 containing the dielectric layer 121 in a case where two or more unit layers 12 are provided, optical properties which the laminate 1 is required to have, etc. The thickness of each dielectric layer 121 is preferably at least 1 nm, more preferably at least 3 nm. When the thickness of the dielectric layer 121 is at least 1 nm, for example, in a case where the metal layer 122 is formed thereon, crystallization of the metal layer 122 can be promoted to make it homogeneous and dense, and a laminate 1 having moisture resistance and abrasion resistance improved can be produced together with the tin zinc oxide layer 13. A thickness of the dielectric layer 121 of 20 nm for example is sufficient, and by a thickness of at most 20 nm, a decrease of properties of the metal layer 122 by roughening of the surface of the dielectric layer 121 can be suppressed.

The dielectric layer 121 is formed in a gas atmosphere in which a gas containing no carbon atom substantially functions as an oxidizing gas, and is preferably formed in an atmosphere having a ratio of a gas containing no carbon atom of at least 50%. It is preferably formed by sputtering using a metal target containing zinc as the main component. The metal target containing zinc as the main component may contain, in addition to zinc, for example, at least one additive element selected from tin, aluminum, chromium, titanium, silicon, boron, magnesium and gallium. In formation of the dielectric layer 121, a gas atmosphere in which a gas containing no carbon atom substantially functions as an oxidizing gas specifically means an atmosphere having a carbon atom content of at most 25 atomic %.

In a case where the dielectric layer 121 containing an additive element is to be formed, the total amount of the additive element is preferably from 0.1 to 10 mass % to the entire metal target. When the content of the additive element is at least 0.1 mass %, a laminate 1 having improved visible light transmittance and near infrared light transmittance will efficiently be obtained. Further, when the content of the additive element is at most 10 mass %, a decrease of the deposition rate, the visible light transmittance, the near infrared light transmittance, etc., an increase of the heat ray emissivity, etc. can be suppressed. When the additive element is contained, its content is more preferably from 0.1 to 5.0 mass %.

The metal layer 122 preferably contains silver as the main component, and specifically preferably contains silver in an amount of at least 90 wt %. The metal layer 122 may contain, in addition to silver, at least one additive element selected from palladium, gold, copper and platinum. By the additive element contained, the visible light transmittance and the near infrared light transmittance can be improved, and the emissivity for a heat ray having a wavelength longer than the visible light or the near infrared light can be reduced, and the stability of silver can be increased.

In the case of a metal layer 122 containing an additive element, the total amount of the additive element is preferably from 0.1 to 10 mass % to the entire metal layer 122. By the content of the additive element being at least 0.1 mass %, the visible light transmittance and the near infrared light transmittance can efficiently be improved, the emissivity for a heat ray having a wavelength longer than the visible light or the near infrared light can efficiently be reduced, and the stability of silver can efficiently be increased. Further, by the content of the additive element being at most 10 mass %, a decrease of the deposition rate, the visible light transmittance, the near infrared light transmittance, etc., an increase of the heat ray emissivity, etc., can be suppressed. When the additive element is contained, its content is more preferably from 0.1 to 5.0 mass %, further preferably from 0.1 to 3.0 mass %.

The thickness of the metal layer 122 is preferably from 5 to 20 nm. By the thickness of the metal layer 122 being at least 5 nm, the surface resistance of the laminate 1 can effectively be reduced, and the heat ray emissivity can be reduced. Further, by the thickness of the metal layer 122 being at most 20 nm, the visible light transmittance and the near infrared light transmittance can be secured. The thickness of the metal layer 122 is more preferably from 7 to 15 nm with a view to securing the visible light transmittance and the near infrared light transmittance while reducing the surface resistance of the laminate 1.

The metal layer 122 is preferably formed by sputtering using a metal target containing silver as the main component. The metal target containing silver as the main component may contain, in addition to silver, for example, at least one additive element selected from palladium, gold, copper and platinum.

In a case where a metal layer 122 containing an additive element is to be formed, the total amount of the additive element is preferably from 0.1 to 10 mass % to the entire metal target. By the content of the additive element being at least 0.1 mass %, it is possible to produce such a laminate 1 that the visible light transmittance and the near infrared light transmittance are improved, the emissivity for a heat ray having a wavelength longer than the visible light or the near infrared light is reduced, and the stability of silver is increased. Further, by the content of the additive element being at most 10 mass %, a decrease of the deposition rate, the visible light transmittance, the near infrared light transmittance, etc., an increase of the heat ray emissivity, etc., can be suppressed. When the additive element is contained, its content is more preferably from 0.1 to 5.0 mass %, further preferably from 0.1 to 3.0 mass %.

On the metal layer 122, a barrier layer 123 to suppress oxidation of the metal layer 122 at the time of formation of the dielectric layer 121 is preferably provided. The barrier layer 123 may, for example, be one containing the metal element contained in the dielectric layer 121, and specifically, one containing zinc as the main component and as the case requires, containing at least one additive element selected from tin, aluminum, chromium, titanium, silicon, boron, magnesium and gallium. Further, the barrier layer 123 may be one containing titanium as the main component.

The thickness of the barrier layer 123 is preferably at least 0.5 nm. The thickness of the barrier layer 123 is the thickness of the barrier layer 123 itself when formed. By the thickness of the barrier layer 123 being at least 0.5 nm, oxidation of the metal layer 122 at the time of formation of the dielectric layer 121 may effectively be suppressed. The thickness of the barrier layer is not necessarily limited so long as it is at least 0.5 nm, and to suppress oxidation of the metal layer 122, a thickness of 10 nm is sufficient, and by the thickness being at most 10 nm, a decrease of the visible light transmittance can be suppressed as the barrier layer 123 remains as a metal.

The sputtering method to form each layer in the first step is not particularly limited and may, for example, be an RF (radio frequency) magnetron sputtering method, a DC (direct current) magnetron sputtering method or an AC magnetron sputtering method. The DC magnetron sputtering method is suitable for uniform formation on a large area substrate such as glass to be used for buildings, automobiles, vehicles, etc., at a low cost with good productivity.

The tin zinc oxide layer 13 in the second step is formed by sputtering using a metal target containing tin and zinc as the main component in an atmosphere containing a gas containing carbon atoms. The metal target preferably contains tin in an amount of from 20 to 80 mass % to the total amount of tin and zinc. By such a metal target, an internal stress of the tin zinc oxide layer 13 is reduced, formation of cracks is suppressed, and a decrease of the moisture resistance by infiltration of moisture can be suppressed. Further, the abrasion resistance of the laminate 1 can be improved together with formation of the dielectric layer 121. The metal target more preferably contains tin in an amount of from 30 to 70 mass %, further preferably from 35 to 65 mass % to the total amount of tin and zinc.

The metal target may contain, in addition to tin and zinc, at least one additive element selected from aluminum, chromium, titanium, silicon, boron, magnesium and gallium. When the additive element is contained, the total amount of the additive element is preferably at most 10 wt % in the entire metal target. By the content of the additive element being at most 10 mass %, a decrease of the deposition rate, the visible light transmittance, the near infrared light transmittance, etc., an increase of the heat ray emissivity, etc. can be suppressed. When the additive element is contained, its content is more preferably at most 5.0 mass %.

The sputtering method is not particularly limited and may, for example, be an RF (radio frequency) magnetron sputtering method, a DC (direct current) magnetron sputtering method or an AC magnetron sputtering method. The DC magnetron sputtering method is suitable for uniform formation on a large area substrate such as glass to be used for buildings, automobiles, vehicles, etc., at a low cost with good productivity.

As the sputtering gas in the sputtering method in the second step, a gas containing carbon atoms is used as a part of or as the entire gas. The gas containing carbon atoms may, for example, be $CO_2$, $CO$, $CH_4$, $C_2H_6$, $C_2H_4$, $C_2H_2$, $CH_3OH$, $C_2H_5OH$ or $C_3H_7OH$. The sputtering gas may, for example, be suitably a gas consisting solely of $CO_2$, a mixed gas consisting of $CO_2$ and Ar, or a mixed gas of $CO_2$, Ar and $O_2$. $CO_2$ is free from explosive properties, combustibility and toxicity, is easily handled and is available at a low cost and is thereby particularly industrially suitable. In a case where a gas having weak or no oxidizing properties other than $CO_2$ is used as the carbon-containing gas, a gas having oxidizing power such as $O_2$ or $N_2O$ i.e. a reactive gas may be properly used in combination to achieve a gas atmosphere which functions as an oxidizing gas.

In a case where sputtering is carried out in a mixed gas of $CO_2$ and Ar, the proportion of $CO_2$ to the total gas flow rate is preferably at least 50%. If the $CO_2$ proportion is less than 50%, metal atoms ejected from the metal target by sputtering tend to be incorporated in the film in an insufficiently oxidized metal state, thus forming a colored film. Further, $O_2$, $N_2O$ or the like may be used together with $CO_2$ as a reactive gas. In such a case also, the proportion of the entire reactive gas to the entire gas flow is preferably at least 50% from the same reasons as above. Further, the proportion of the flow rate of the gas containing carbon atoms in the entire reactive gas is preferably at least 50%, more preferably at least 65%, further preferably at least 80%.

The flow rate of the sputtering gas varies depending upon the sputtering conditions. For example, in a case where the target size is 70 mm×200 mm, the sputtering gas flow rate is preferably from 30 to 200 sccm (cc/min as calculated as the normal condition). The sputtering conditions depend on apparatus conditions such as the volume of the sputtering deposition chamber, the area of the target, the evacuation rate of the vacuum pump, the introduction gas flow rate, and the arrangement of the target and the substrate.

Now, a specific example of the second step will be described. Prior to deposition, a chamber is evacuated of air to a degree of vacuum of $2.0 \times 10^{-4}$ Pa. Using a target of 70 mm×200 mm, a direct current power of 500 W is applied to the tin zinc metal target at a flow rate of $CO_2$ introduced to the chamber as the sputtering gas of 100 sccm under a sputtering pressure of 0.6 Pa, whereby a transparent tin zinc oxide layer 13 is obtained. The internal stress of the obtained tin zinc oxide layer 13 is about 200 MPa (compressive stress). The internal stress when $O_2$ gas is used instead of $CO_2$ is about 400 MPa (compressive stress).

The tin zinc oxide layer 13 preferably contains tin in an amount of from 20 to 80 mass % to the total amount of tin and zinc. By such a tin zinc oxide layer 13, the internal stress can be reduced, and formation of cracks can be suppressed, whereby a decrease of the moisture resistance by infiltration of moisture can be suppressed. Further, the abrasion resistance of the laminate 1 can be improved together with formation of the dielectric layer 121. The tin zinc oxide layer 13 more preferably contains tin in an amount of from 30 to 70 mass %, further preferably from 35 to 65 mass % to the total amount of tin and zinc.

Further, the tin zinc oxide layer 13 may contain, in addition to tin and zinc, at least one additive element selected from aluminum, chromium, titanium, silicon, boron, magnesium and gallium. In a case where the additive element is contained, the total amount of the additive element is preferably at most 10 mass % to the total amount of tin, zinc and the additive element. By the content of the additive element being at most 10 mass %, a decrease of the deposition rate, the visible light transmittance, the near infrared light transmittance, etc., an increase of the heat ray emissivity, etc. can be suppressed. In a case where the additive element is contained, its content is more preferably at most 5.0 mass %.

The proportion of carbon in the tin zinc oxide layer 13 is preferably from 0.1 to 10 atomic % to the total amount of tin and zinc. When the proportion is at least 0.1 atomic %, the effect by incorporation of carbon can be obtained, and a laminate 1 having reduced internal stress, excellent moisture resistance and improved abrasion resistance can be obtained. Further, when the proportion is at most 10 atomic %, the strength of the film will not be lowered by carbon. The proportion of carbon in the tin zinc oxide layer 13 is more preferably from 1 to 5 atomic %, further preferably from 1.5 to 3 atomic % to the total amount of tin and zinc.

The thickness of each tin zinc oxide layer 13 is preferably at least 3 nm, more preferably at least 10 nm. When the thickness of the tin zinc oxide layer 13 is at least 3 nm, a laminate 1 having improved moisture resistance and abrasion resistance can be produced together with the dielectric layer 121. The thickness of the tin zinc oxide layer 13 is not necessarily limited so long as it is at least 3 nm, however, if it is excessively thick, only a low visible light transmittance insufficient for use as a window for buildings, automobiles or railway vehicles will be obtained. Accordingly, the thickness of each tin zinc oxide layer 13 is preferably at most 100 nm, more preferably at most 80 nm. Further, when at least two tin zinc oxide layers 13 are provided, the total thickness is more preferably at most 300 nm, further preferably at most 250 nm.

The base layer 14 is formed as the case requires by sputtering using a metal target containing tin and zinc as the main component in a gas atmosphere in which a gas containing carbon atoms substantially functions as an oxidizing gas in a preliminary step carried out prior to the first step first carried out among the first steps. Formation of the base layer 14 can be carried out basically in the same manner as formation of the tin zinc oxide layer 13.

That is, the metal target for formation of the base layer 14 preferably contains tin in an amount of from 20 to 80 mass % to the total amount of tin and zinc. By such a metal target, the internal stress of the tin zinc oxide layer 13 can be reduced, formation of cracks is suppressed, and a decrease of the moisture resistance by infiltration of moisture can be suppressed. Further, the abrasion resistance of the laminate 1 can be improved together with formation of the dielectric layer 121. The metal target more preferably contains tin in an amount of from 30 to 70 mass %, further preferably from 35 to 65 mass % to the total amount of tin and zinc.

Further, the metal target for formation of the base layer 14 may contain, in addition to tin and zinc, at least one additive element selected from aluminum, chromium, titanium, silicon, boron, magnesium and gallium. In a case where the additive element is contained, the total amount of the additive element is preferably at most 10 mass % in the entire metal target. By the content of the additive element being at most 10 mass %, a decrease of the deposition rate, the visible light transmittance, the near infrared light transmittance, etc., an increase of the heat ray emissivity, etc. can be suppressed. When the additive element is contained, the content is more preferably at most 5.0 mass %.

The sputtering method for formation of the base layer 14 is not particularly limited and may, for example, be an RF (radio frequency) magnetron sputtering method, a DC (direct current) magnetron sputtering method or an AC magnetron sputtering method. The DC magnetron sputtering method is suitable for uniform formation on a large area substrate such as glass to be used for buildings, automobiles, vehicles, etc., at a low cost with good productivity.

As the sputtering gas in the sputtering method for formation of the base layer 14, a gas containing carbon atoms is used as a part of or as the entire gas. The gas containing carbon atoms may, for example, be $CO_2$, $CO$, $CH_4$, $C_2H_6$, $C_2H_4$, $C_2H_2$, $CH_3OH$, $C_2H_5OH$ or $C_3H_7OH$. The sputtering gas may, for example, be preferably a gas consisting solely of $CO_2$, a mixed gas consisting of $CO_2$ and Ar, or a mixed gas of $CO_2$, Ar and $O_2$. $CO_2$ is free from explosive properties, combustibility and toxicity, is easily handled and is available at a low cost and is thereby particularly industrially suitable. Further, in a case where a gas having weak or no oxidizing properties other than $CO_2$ is used as the carbon-containing gas, a gas having oxidizing power such as $O_2$ or $N_2O$ i.e. a reactive gas may be properly used in combination.

The base layer 14 preferably contains tin in an amount of from 20 to 80 mass % to the total amount of tin and zinc. By such a base layer 14, the abrasion resistance of the laminate 1 can be improved together with formation of the dielectric layer 121. The tin zinc oxide layer 13 more preferably contains tin in amount of from 30 to 70 mass %, further preferably from 35 to 65 mass % to the total amount of tin and zinc.

Further, the base layer 14 may contain, in addition to tin and zinc, at least one additive element selected from aluminum, chromium, titanium, silicon, boron, magnesium and gallium. In a case where the additive element is contained, the total amount of the additive element is preferably at most 10 mass % to the total amount of tin, zinc and the additive element. By the content of the additive element being 10 mass %, a decrease of the deposition rate, the visible light transmittance, the near infrared light transmittance, etc., an increase of the heat ray emissivity, etc. can be suppressed. When the additive element is contained, its content is more preferably at most 5.0 mass %.

The proportion of carbon in the base layer 14 is more preferably from 0.1 to 10 atomic % to the total amount of tin and zinc. When the proportion is at least 0.1 atomic %, an effect by incorporation of carbon can be obtained, and a laminate 1 having reduced internal stress, excellent moisture resistance and improved abrasion resistance can be obtained. Further, when the proportion is at most 10 atomic %, the strength of the film will not be decreased by carbon. The proportion of carbon in the base layer 14 is more preferably 1 to 5 atomic %, further preferably from 1.5 to 3 atomic % to the total amount of tin and zinc.

The thickness of the base layer 14 is preferably at least 3 nm, more preferably at least 10 nm. By the thickness of the base layer 14 being at least 3 nm, a laminate 1 having improved moisture resistance and abrasion resistance can be produced. The thickness of the base layer 14 is not necessarily limited so long as it is at least 3 nm, however, if it is excessively thick, only a low visible light transmittance insufficient for use as a window for buildings, automobiles or railway vehicles will be obtained. Accordingly, the thickness of the base layer 14 is more preferably at most 80 nm, further preferably at most 50 nm. Further, the total thickness of the base layer 14 and all the tin zinc oxide layers 13 is preferably at most 380 nm, further preferably at most 300 nm.

The laminate 1 can be suitably used, for example, for production of double glass or laminated glass. Double glass is composed of a transparent counter substrate such as a glass substrate facing the laminate 1. Between the laminate 1 and the transparent counter substrate, spacers are disposed at the periphery so as to form a void between them. In the void, for example, an inert gas such as an argon gas or dry air is enclosed. Each spacer has, for example, a tubular shape, has a pore communicating with the void and has a drying agent to suppress condensation filled in the tube. The space between the laminate 1 and the spacers, and the space between the transparent counter substrate and the spacers, are sealed with a primary sealing material. Further, the periphery of the spacers is sealed with a secondary sealing material between the laminate 1 and the transparent counter substrate 11. Further, laminate glass is produced, for example, in such a manner that the laminate 1 and a transparent counter substrate such as a glass substrate are laminated with an interlayer for glass interposed therebetween, followed by thermo-compression bonding.

EXAMPLES

Now, the present invention will be specifically described with reference to Examples of the present invention and Comparative Examples.

However, the present invention is by no means restricted to such specific Examples.

Ex. 1 to 8

On a sufficiently cleaned substrate of soda lime silica glass (10 cm×10 cm×3 mm thickness), the respective layers were formed under deposition conditions as identified in Table 2 by a direct current sputtering method to produce a laminate. Ex. 1 to 3 are Examples of the present invention, and Ex. 4 to 8 are Comparative Examples.

In Table 1, "G" represents soda lime silica glass (10 cm×10 cm×3 mm thickness), in Tables 1 and 2, "C:$ZnSn_xO_y$" means a carbon-containing $ZnSn_xO_y$ layer, and "C:$ZnAl_xO_y$" a carbon-containing $ZnAl_xO_y$ layer. In Ex. 1 to 3 in Table 1, the C:$ZnSn_xO_y$ layer corresponds to the base layer or the tin zinc oxide layer, and the $ZnAl_xO_y$ layer corresponds to the dielectric layer. Further, in Ex. 1 to 3 in Table 1, "//" represents separation of the base layer, the unit layer and the tin zinc oxide layer.

In Table 2, "gas" means the gas in the sputtering atmosphere, and "pressure" means the pressure during sputtering. "2 wt % Al—Zn" means a target containing aluminum in an amount of 2 mass % in zinc, "1 wt % Pd—Ag" means a target containing palladium in an amount of 1 mass % in silver and "50 wt % Sn—Zn" means a target containing tin in an amount of 50 mass % in zinc.

The $CO_2$ flow rate during deposition of the C:$ZnSn_xO_y$ layer was 100 sccm in each case. The $CO_2$ flow rate at the time of deposition of the C:$ZnAl_xO_y$ layer was 100 sccm in each case. The flow rate of the mixed gas of Ar and $O_2$ was Ar: 30 sccm and $O_2$: 70 sccm in each case. The proportion of carbon (the proportion of carbon to the total amount of zinc and tin) in the C:$ZnSn_xO_y$ layer was from 2.1 to 2.4 atomic %. The proportion of carbon was measured by using Q2000μ-XPS apparatus manufactured by ULVAC-PHI, Inc. under analysis conditions of AlKα as an X-ray source, 100 μm in diameter, 25 W and 15 kV. Further, as the calculation method, peaks were narrowed down to C1s, O1s, Sn3d5 and Zn2p3 peaks, narrow analysis was carried out, the background was subtracted, and the proportion was calculated taking the whole to be 100%.

TABLE 2

| layer | Target | Gas | Sputtering pressure (Pa) |
|---|---|---|---|
| $ZnAl_xO_y$ | 2 wt % Al—Zn | Ar + $O_2$ | 0.5 |
| C: $ZnAl_xO_y$ | 2 wt % Al—Zn | $CO_2$ | 0.6 |
| C: $ZnSn_xO_y$ | 50 wt % Sn—Zn | $CO_2$ | 0.6 |
| Ag | Ag | Ar | — |
| Ag—Pd | 1 wt % Pd—Ag | Ar | — |
| Zn—Al | 2 wt % Al—Zn | Ar | — |
| Ti | Ti | Ar | — |

Further, the internal stresses of the C:$ZnSn_xO_y$ layer, the $ZnSn_xO_y$ layer, the C:$ZnAl_xO_y$ layer and the $ZnAl_xO_y$ layer are shown in Table 3. Values in brackets after the respective layers in Table 3 represents the film thicknesses. The measurement of the internal stress was carried out with respect to each of the C:$ZnSn_xO_y$ layer, the $ZnSn_xO_y$ layer, the C:$ZnAl_xO_y$ layer and the $ZnAl_xO_y$ layer formed by itself on a 4-inch silicon wafer by a direct current sputtering method under deposition conditions as shown in Table 2, using "FLX-2320 Thin Film Stress Measurement System (tradename)" manufactured by TEMCOR.

Further, the $CO_2$ flow rate at the time of deposition of the C:$ZnSn_xO_y$ layer was 100 sccm, and the $CO_2$ flow rate at the time of deposition of the C:$ZnAlxOy$ layer was 100 sccm. Further, the flow rate of the mixed gas of Ar and $O_2$ was Ar: 30 sccm and $O_2$: 70 sccm. In Table 3, "○" means an internal stress of at most 230 MPa (compressive stress), "Δ" means 231 to 500 MPa (compressive stress) and "X" means at least 501 MPa (compressive stress).

TABLE 3

| | Internal stress |
|---|---|
| C: $ZnSn_xO_y$ (24 nm and 48 nm) | ○ |
| $ZnSn_xO_y$ (24 nm and 48 nm) | Δ |
| C: $ZnAl_xO_y$ (24 nm and 48 nm) | x |

Further, the laminate in each Example was evaluated as follows.

(Moisture Resistance)

The moisture resistance of the laminate was evaluated. Evaluation was carried out by measuring the number of white spots having a diameter of at least 0.5 mm in a 100 mm square, after the laminate was stored in a thermostatic bath at a temperature of 50° C. under a humidity of 90% RH for 2 weeks. The results are shown in Table 4. Evaluation was carried out with respect to the laminates in Examples 1, 2, 4

TABLE 1

Constitution of laminate (geometrical film thickness [nm])

Ex. 1  G//C: $ZnSn_xO_y$(15)//$ZnAl_xO_y$(5)/Ag—Pd(10)/Zn—Al(2)/$ZnAl_xO_y$(5)//C: $ZnSn_xO_y$(70)// $ZnAl_xO_y$(5)/Ag—Pd(10)/Zn—Al(2)/$ZnAl_xO_y$(5)//C: $ZnSn_xO_y$(35)

Ex. 2  G//$ZnAl_xO_y$(20)/Ag—Pd(10)/Zn—Al(2)/$ZnAl_xO_y$(5)//C: $ZnSn_xO_y$(40)

Ex. 3  G//C: $ZnSn_xO_y$(15)//$ZnAl_xO_y$(5)/Ag(10)/Ti(2)/$ZnAl_xO_y$(5)//C: $ZnSn_xO_y$(70)// $ZnAl_xO_y$(5)/Ag(10)/Ti(2)/$ZnAl_xO_y$(5)//C: $ZnSn_xO_y$(35)

Ex. 4  G/C: $ZnAl_xO_y$(20)/Ag—Pd(10)/Zn—Al(2)/C: $ZnAl_xO_y$(80)/ Ag—Pd(10)/Zn—Al(2)/C: $ZnAl_xO_y$(40)

Ex. 5  G/$ZnAl_xO_y$(20)/Ag—Pd(10)/Zn—Al(2)/$ZnAl_xO_y$(40)

Ex. 6  G/C: $ZnSn_xO_y$(20)/Ag—Pd(10)/Zn—Al(2)/C: $ZnSn_xO_y$(80)/ Ag—Pd(10)/Zn—Al(2)/C: $ZnSn_xO_y$(40)

Ex. 7  G/C: $ZnSn_xO_y$(15)/$ZnAl_xO_y$(5)/Ag—Pd(10)/Zn—Al(2)/C: $ZnSn_xO_y$(75)/ $ZnAl_xO_y$(5)/Ag—Pd(10)/Zn—Al(2)/$ZnAl_xO_y$(5)/C: $ZnSn_xO_y$(35)

Ex. 8  G/C: $ZnSn_xO_y$(15)/C: $ZnAl_xO_y$(5)/Ag(10)/Ti(2)/C: $ZnAl_xO_y$(5)/C: $ZnSn_xO_y$(70)/ C: $ZnAl_xO_y$(5)/Ag(10)/Ti(2)/C: $ZnAl_xO_y$(5)/C: $ZnSn_xO_y$(35)

and 5, and "○" means a number (number/100 mm square) of white spots less than 10, and "x" means a number (number/100 mm square) of white spots of 10 or more.

TABLE 4

|  | moisture resistance |
|---|---|
| Ex. 1 | ○ |
| Ex. 2 | ○ |
| Ex. 4 | x |
| Ex. 5 | x |

(Crystallinity of Metal Layer)

The crystallinity of the metal layer (Ag—Pd layer) in the laminate was evaluated. Evaluation was carried out by the peak intensity and the half value width in a diffraction peak profile of θ/2θ measurement by an XRD apparatus. The results are shown in Table 5. Evaluation was carried out with respect to the laminates in Ex. 1, 4 and 6. In Table 5, "○" means that the value obtained by dividing Ag (111) peak count [cps] by the 2θ half value width [°] was at least 6,000, "Δ" means that the value was at least 3,000 and less than 6,000, and "x" means that the value was less than 3,000.

TABLE 5

|  | Crystallinity |
|---|---|
| Ex. 1 | ○ |
| Ex. 4 | Δ |
| Ex. 6 | x |

(Abrasion Resistance)

The abrasion resistance of the laminate was evaluated. Evaluation was carried out using "washability and scrub resistance tester, model 494" manufactured by ERICHSEN in such a manner that a tank was filled with water, and a pad having a load applied thereto was moved back and forth 500 times or 1,000 times on a 100 mm square test specimen, and the surface of the test specimen was visually observed. The results are shown in Table 6. In Table 6, "○" means that no scars or film peeling occurred, "Δ" means that slight scars or film peeling only on an edge portion occurred, and "x" means that severe scars or film peeling even at a center portion occurred.

TABLE 6

|  | Abrasion resistance | |
|---|---|---|
|  | 500 Back and forth movement | 1,000 Back and forth movement |
| Ex. 1 | ○ | ○ |
| Ex. 2 | ○ | ○ |
| Ex. 3 | ○ | ○ |
| Ex. 4 | Δ | x |
| Ex. 5 | Δ | Δ |
| Ex. 6 | x | x |
| Ex. 7 | x | x |
| Ex. 8 | x | x |

Only insufficient abrasion resistance is obtained in a case where the dielectric layer is a carbon-containing $ZnSn_xO_y$ layer as in the case of the laminate in Ex. 6, in a case where the laminate does not necessarily have a predetermined repeated structure as in Ex. 7, and in a case where the dielectric layer is a carbon-containing $ZnAl_xO_y$ layer as in the laminate in Ex. 8. The abrasion resistance is slightly improved but is not necessarily sufficient in a case where the dielectric layer is a carbon-containing $ZnAl_xO_y$ layer as in the laminate in Ex. 4 and in a case where the dielectric layer is a $ZnAl_xO_y$ layer as in the laminate in Ex. 5. Excellent abrasion resistance will be obtained in the case of the laminates in Ex. 1 to 3, for example in Ex. 2 in which the dielectric layer 121 is a dielectric layer containing no carbon such as the $ZnAl_xO_y$ layer and in Ex. 1 and 3 in which a carbon-containing $ZnSn_xO_y$ layer is used in combination with a dielectric layer containing no carbon such as the $ZnSn_xO_y$ layer to achieve a predetermined structure.

INDUSTRIAL APPLICABILITY

According to the process for producing a laminate of the present invention, it is possible to produce a laminate having moisture resistance and abrasion resistance improved, by carrying out a first step of forming a dielectric layer, a metal layer and a dielectric layer in this order, and then carrying out sputtering using a metal target containing tin and zinc as the main component in an atmosphere containing a gas containing carbon atoms to form a tin zinc oxide layer containing an oxide of tin and zinc as the main component.

Further, by the laminate of the present invention, the moisture resistance and the abrasion resistance can be improved by having a tin zinc oxide layer containing an oxide of tin and zinc as the main component and containing carbon in an amount of at least 0.1 atomic % to the total amount of tin and zinc on a unit layer consisting of a dielectric layer, a metal layer and a dielectric layer formed in this order.

This application is a continuation of PCT Application No. PCT/JP2013/055573, filed on Feb. 28, 2012, which is based upon and claims the benefit of priority from Japanese Patent Application No. 2012-041393 filed on Feb. 28, 2012. The contents of those applications are incorporated herein by reference in their entireties.

REFERENCE SYMBOLS

1: laminate, 11: transparent substrate, 12: unit layer, 13: tin zinc oxide layer, 14: base layer, 121: dielectric layer, 122: metal layer, 123: barrier layer

What is claimed is:

1. A laminate which comprises:
a transparent substrate,
a unit layer formed on the transparent substrate, said unit layer comprising a first dielectric layer, a metal layer, a barrier layer, and a second dielectric layer in this order starting from the transparent substrate side, said first and second dielectric layers formed in a gas atmosphere in which a gas comprising no carbon substantially functions as an oxidizing gas, and
a tin zinc oxide layer formed directly on the second dielectric layer of the unit layer, said tin zinc oxide layer comprising an oxide of tin and zinc as the main component and further comprising carbon in an amount of at least 0.1 atomic % to the total amount of tin and zinc.

2. The laminate according to claim 1, wherein the tin zinc oxide layer contains carbon in an amount of at least 0.1 atomic % and at most 10 atomic % to the total amount of tin and zinc.

3. The laminate according to claim 1, wherein the tin zinc oxide layer contains tin in an amount of from 20 to 80 mass % to the total amount of tin and zinc.

4. The laminate according to claim 1, wherein said first and second dielectric layers comprise no carbon.

5. The laminate according to claim 1, further comprising a base layer comprising an oxide of tin and zinc as the main component and comprising carbon in an amount of at least 0.1 atomic % located between the transparent substrate and the unit layer closest to the transparent substrate.

6. The laminate according to claim 5, wherein said first and second dielectric layers comprise no carbon.

7. The laminate according to claim 1, comprising a plurality of said unit layers and a plurality of said tin zinc oxide layers, where a first unit layer is formed on the transparent substrate, a first tin zinc oxide layer is formed directly on the second dielectric layer of the first unit layer, a second unit layer is formed on the first tin zinc oxide layer, a second tin zinc oxide layer is formed directly on the second dielectric layer of the second unit layer, and repeating in this manner if more than two unit layers and more than two tin zinc oxide layers are present, wherein a final unit layer is formed on a next to final tin zinc oxide layer and a final tin zinc oxide layer is formed directly on the second dielectric layer of the final unit layer.

8. The laminate according to claim 7, comprising 3 unit layers and 3 tin zinc oxide layers.

9. The laminate according to claim 7, comprising 4 unit layers and 4 tin zinc oxide layers.

10. The laminate according to claim 7, wherein said first and second dielectric layers comprise no carbon.

\* \* \* \* \*